(12) United States Patent
Lin et al.

(10) Patent No.: US 9,153,440 B2
(45) Date of Patent: Oct. 6, 2015

(54) METHOD OF FORMING A SEMICONDUCTOR DEVICE

(75) Inventors: Chih-Han Lin, Zhubei (TW);
Ming-Ching Chang, Hsinchu (TW);
Ryan Chia-Jen Chen, Chiayi (TW);
Yih-Ann Lin, Jhudong Township (TW);
Jr-Jung Lin, Wurih Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 162 days.

(21) Appl. No.: 13/428,923

(22) Filed: Mar. 23, 2012

(65) Prior Publication Data
US 2013/0252425 A1 Sep. 26, 2013

(51) Int. Cl.
*H01L 21/308* (2006.01)
*H01L 21/033* (2006.01)
*H01L 21/311* (2006.01)
*H01L 21/768* (2006.01)

(52) U.S. Cl.
CPC ........ *H01L 21/0337* (2013.01); *H01L 21/0338* (2013.01); *H01L 21/3086* (2013.01); *H01L 21/3088* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| 5,328,810 A * | 7/1994 | Lowrey et al. ............ 430/313 |
| 7,666,578 B2 * | 2/2010 | Fischer et al. ............ 430/314 |
| 2009/0104786 A1 * | 4/2009 | Narita ............ 438/763 |

* cited by examiner

Primary Examiner — Lan Vinh
Assistant Examiner — Jiong-Ping Lu
(74) Attorney, Agent, or Firm — Hauptman Ham, LLP

(57) ABSTRACT

A method includes providing a first mask pattern over a substrate, forming first spacers adjoining sidewalls of the first mask pattern, removing the first mask pattern, forming second spacers adjoining sidewalls of the first spacers, forming a filling layer over the substrate and between the second spacers, and forming a second mask pattern over the substrate.

20 Claims, 9 Drawing Sheets

METHOD OF FORMING A SEMICONDUCTOR DEVICE

BACKGROUND

The semiconductor industry has experienced exponential growth. Continuous advancements in lithographic resolution have paced uninterruptedly to support critical dimensions (CDs) of 90 nm to 65 nm, 45 nm, 32 nm, 22 nm, 16 nm and below. New techniques in lithography have been developed, such as immersion lithography, multiple patterning, extreme ultraviolet (EUV) lithography and e-beam lithography. The challenges being raised by new lithography techniques are not only in resolution but also in economy (e.g., cost of upgrading and loss of throughput). A lot of developments have focused on extending existing lithography techniques to the next technology generation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
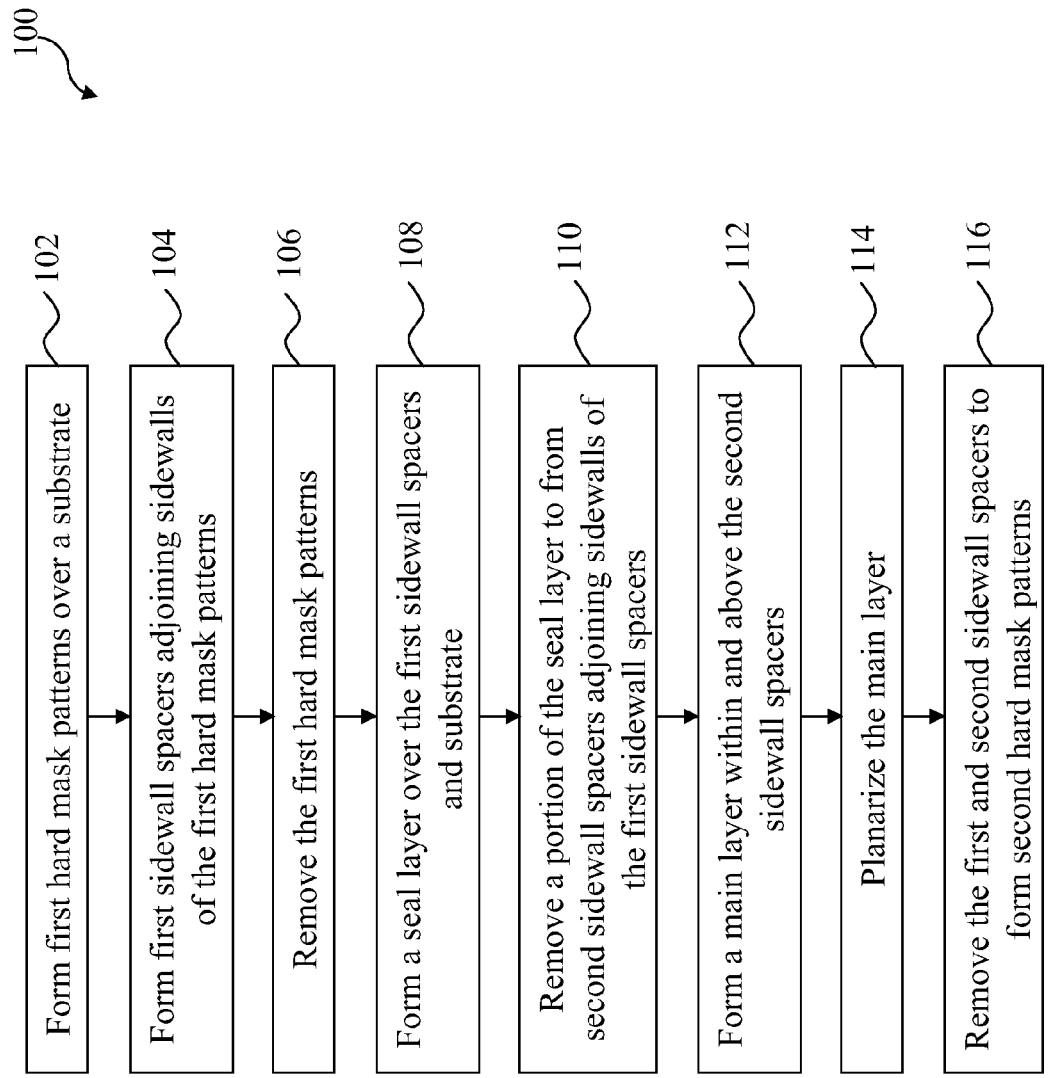
FIG. 1 is a flowchart of a method of forming a semiconductor device according to various embodiments of the present disclosure.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, are within the scope of this disclosure.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

With reference to FIGS. 1 and 2-9, a method 100 and a semiconductor device 200 in accordance with some embodiments are collectively described below. The semiconductor device 200 comprises an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 of fabricating a semiconductor device is described according to various embodiments of the present disclosure. The method 100 begins with step 102 in which a substrate is provided. The substrate includes first hard mask patterns. The method 100 continues with step 104 in which first sidewall spacers are formed adjoining sidewalls of the first hard mask patterns. The method 100 continues at step 106 in which the first hard mask patterns are removed. The method 100 continues at step 108 in which a seal layer is deposited over the first sidewall spacers and substrate. The method 100 continues at step 110 in which a portion of the seal layer is removed to form second sidewall spacers adjoining sidewalls of the first sidewall spacers. The method 100 continues at step 112 in which a main layer is filled within the second sidewall spacers and over the second sidewall spacers. The method 100 continues at step 114 in which the main layer is planarized. The method 100 continues at step 116 in which the first and second sidewall spacers are removed to form the second hard mask patterns. The discussion that follows describes the semiconductor device 200 at various stages during fabrication according to the method 100 of FIG. 1.

Figure 2:
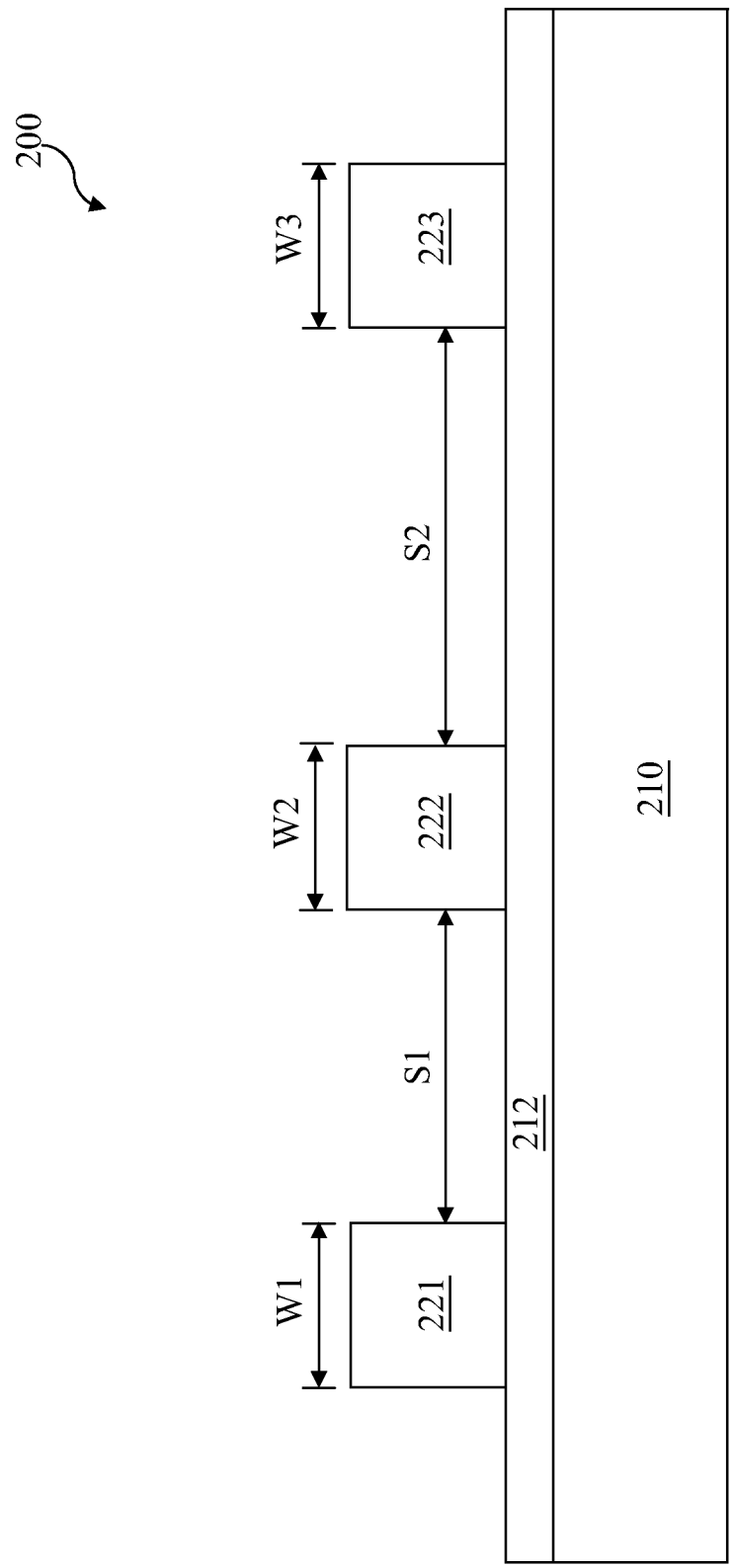
FIGS. 2 to 9 are schematic cross-sectional side views of one embodiment of a semiconductor device at various stages of fabrication according to the method of FIG. 1.

FIGS. 2 to 9 illustrate diagrammatic cross-sectional side views of one embodiment of a semiconductor device 200 at various stages of fabrication according to the method 100 of FIG. 1. Referring to FIGS. 1 and 2, the method 100 begins at step 102 wherein a substrate 210 with first hard mask patterns 221, 222, and 223 is provided. In some embodiments, the substrate 210 is a semiconductor substrate including silicon. Alternatively, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative, the semiconductor substrate could be a semiconductor on insulator (SOI).

A target layer 212 is further included over the substrate 210. In some embodiments, the target layer 212 comprises a low-k dielectric material formed by chemical vapor deposition (CVD) technique. The low-k dielectric material is selected from the group consisting of fluorine content, carbon content, air content and porous structure. It has a k constant (dielectric constant) below 3. In one or more embodiments, additionally, a post deposition thermal process may imply to improve mechanical properties of the low-k dielectric.

The first hard mask patterns 221, 222, and 223 are formed over the target layer 212, wherein the first hard mask pattern 222 is located between the first hard mask patterns 221 and 223 as shown in FIG. 2. The first hard mask patterns 221, 222, and 223 have widths W1, W2, and W3, respectively. In some embodiments, the widths W1, W2, and W3 are substantially the same. Alternatively, the widths W1, W2, and W3 are different. Spacings S1 and S2 are defined between the first hard mask patterns 221/222 and the first hard mask patterns 222/223, respectively. In some embodiments, the spacings S1 and S2 are different. Alternatively, the spacings S1 and S2 are substantially the same. In some embodiments, the first hard mask patterns 221, 222, and 223 include $SiO_2$, $Si_3N_4$, SiON, TEOS, high-k materials, BPSG, FSG, PSG, BSG, other suitable materials, or combinations thereof. In some embodiments, the first hard mask patterns 221, 222, and 223 have a thickness ranging between about 100 angstroms and about 5000 angstroms.

In some embodiments, the first hard mask patterns 221, 222, and 223 are formed by depositing a hard mask layer (not shown) over the target layer 212, patterning the hard mask layer by a lithography technique, and etching the hard mask layer. The etching process, for example, includes an anisotropic dry etching with an adequate etch selectivity with respect to the target layer 212 to minimize a loss of the target layer 212 during the etching process. In some embodiments, the hard mask layer is etched by a plasma etch with $CF_4$ and $CHF_3$ gases. In some embodiments, the hard mask layer is formed by CVD, high density plasma CVD, spin-on methods, sputtering, and/or other suitable methods.

Figure 3:
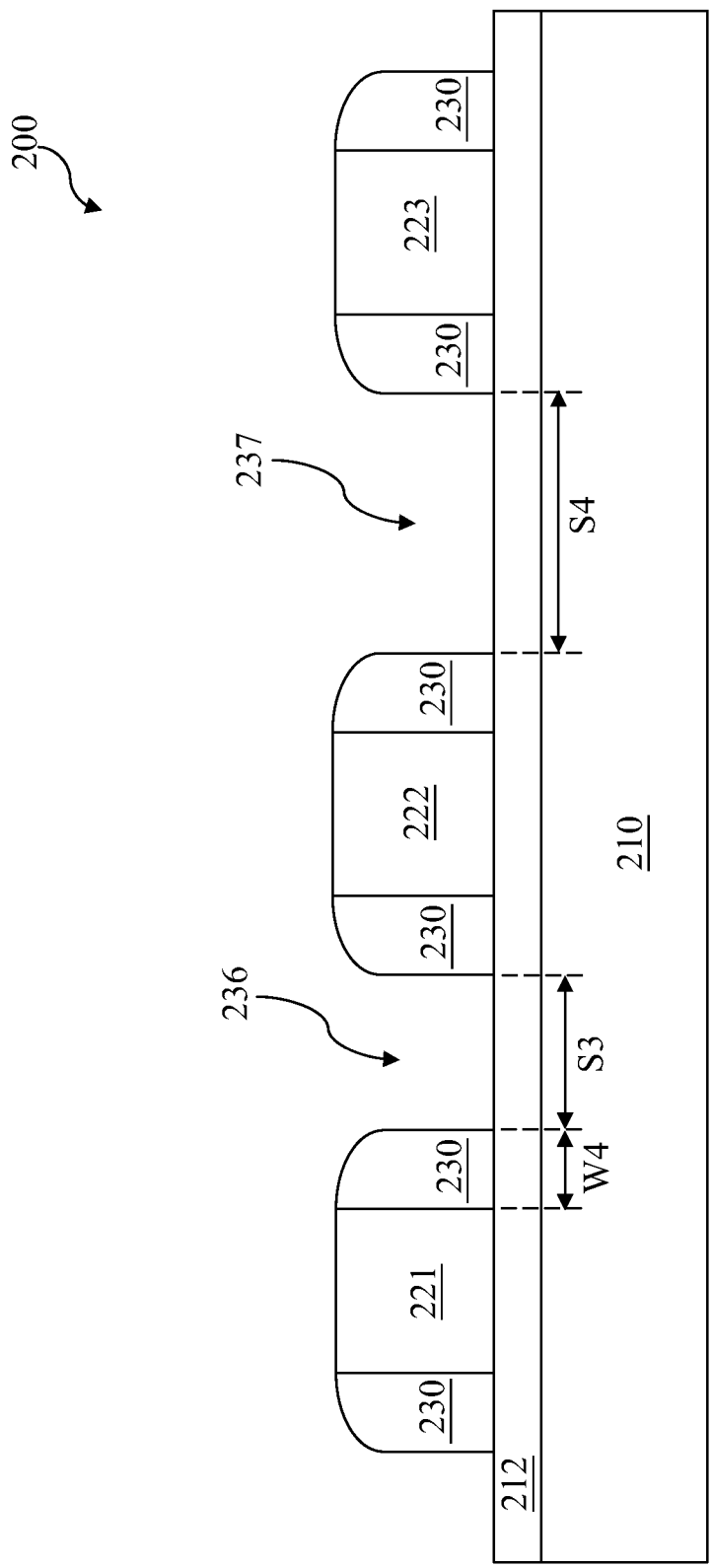

Referring to FIGS. 1 and 3, the method 100 proceeds to step 104 wherein first sidewall spacers 230 are formed adjoining sidewalls of the first hard mask patterns 221, 222, and 223. In some embodiments, the first sidewall spacers 230 include a dielectric material such as silicon oxide ($SiO_2$), silicon nitride ($Si_3N_4$), silicon carbide (SiC), oxynitride (SiON), a high-k dielectric, a low-k dielectric, or combinations thereof. In some embodiments, the material of the first sidewall spacers 230 is etched faster with respect to the material of first hard mask patterns 221, 222, and 223 during a subsequent spacer etching process. In one embodiment, the first hard mask patterns 221, 222, and 223 include $SiO_2$ formed by CVD and the first sidewall spacers 230 include $Si_3N_4$, SiON, nitrided oxide, metal, or TiN. In another embodiment, the first hard mask patterns 221, 222, and 223 include $Si_3N_4$ formed by CVD and the first sidewall spacers 230 include SiON, or $SiO_2$ formed by CVD. In another embodiment, the first hard mask patterns 221, 222, and 223 include a material of photoresist or organic material and the first sidewall spacers 230 include CVD $Si_3N_4$, SiON, or nitrided oxide.

The first sidewall spacers 230 are formed, for example, by depositing a spacer film (not shown) overlying the target layer 212, the first hard mask patterns 221, 222, and 223. Then, one or more etching (anisotropic etching technique) processes may be applied on the spacer film. In some embodiments, the spacer film has a thickness ranging between about 5 angstroms and about 3000 angstroms. In some embodiments, the etching process leaves portions of the spacer film adjoining sidewalls of the first hard mask patterns 221, 222, and 223 to form the first sidewall spacers 230. In some embodiments, the etching process removes portions of the spacer film to exposes the top areas of the first hard mask patterns 221, 222, and 223. In some embodiments, the etching process removes another portions of the spacer film to expose portions of the target layer 212, referring to as a recess 236 between the first hard mask patterns 221, 222 and a recess 237 between the first hard mask patterns 222, 223, as shown in FIG. 3. The recesses 236, 237 have spacings S3, S4, respectively.

The spacer etching process may include an anisotropic dry etching process with an adequate high selectivity with respect to the target layer 212, the first hard mask patterns 221, 222, and 223. The mechanism of etching in each dry etching process may have a physical basis (e.g. glow-discharge sputtering, or ion milling) or a chemical basis (e.g., in pure plasma etching) or a combination of both (e.g., reactive ion etching or RIE). Sputtering relies on the directional nature of the incident energetic ions to etch in a highly anisotropic manner. Pure plasma etching or a chemical basis etching may achieve a very high selectivity against both mask material and underlying layers and typically etches in an isotropic fashion. Combining both physical and chemical mechanism etching offers a controlled anisotropic etching process with adequate selectivity. In one or more embodiments, the spacer etching process includes a plasma etch containing $CF_4$, SF6 and $CH_2F_2$ gases.

With continued reference to FIG. 3, a width W4 of the first sidewall spacers 230 is defined by the spacer etching process. Therefore, the spacings S3 and S4 are substantially equal to (S1-2W4) and (S2-2W4), respectively. As mentioned above, the spacings S1 and S2 are different in some embodiments. Therefore, in some embodiments, the spacings S3 and S4 are different. The width W4 of the first sidewall spacers 230 is used as one of parameters to define the CD of the target feature (not shown) in a future process, which will be described later. The width W4 of the first sidewall spacers 230 may be controlled by process conditions such as deposition thickness of the film for forming the first sidewall spacers 230, sidewall spacer etching type, etching rate, etching depth, etching pressure, or combinations thereof. In some embodiments, the width W4 ranges from about 2 nm to about 100 nm. In some embodiments, the width W4 ranges from about 2 nm to about 30 nm.

Figure 4:
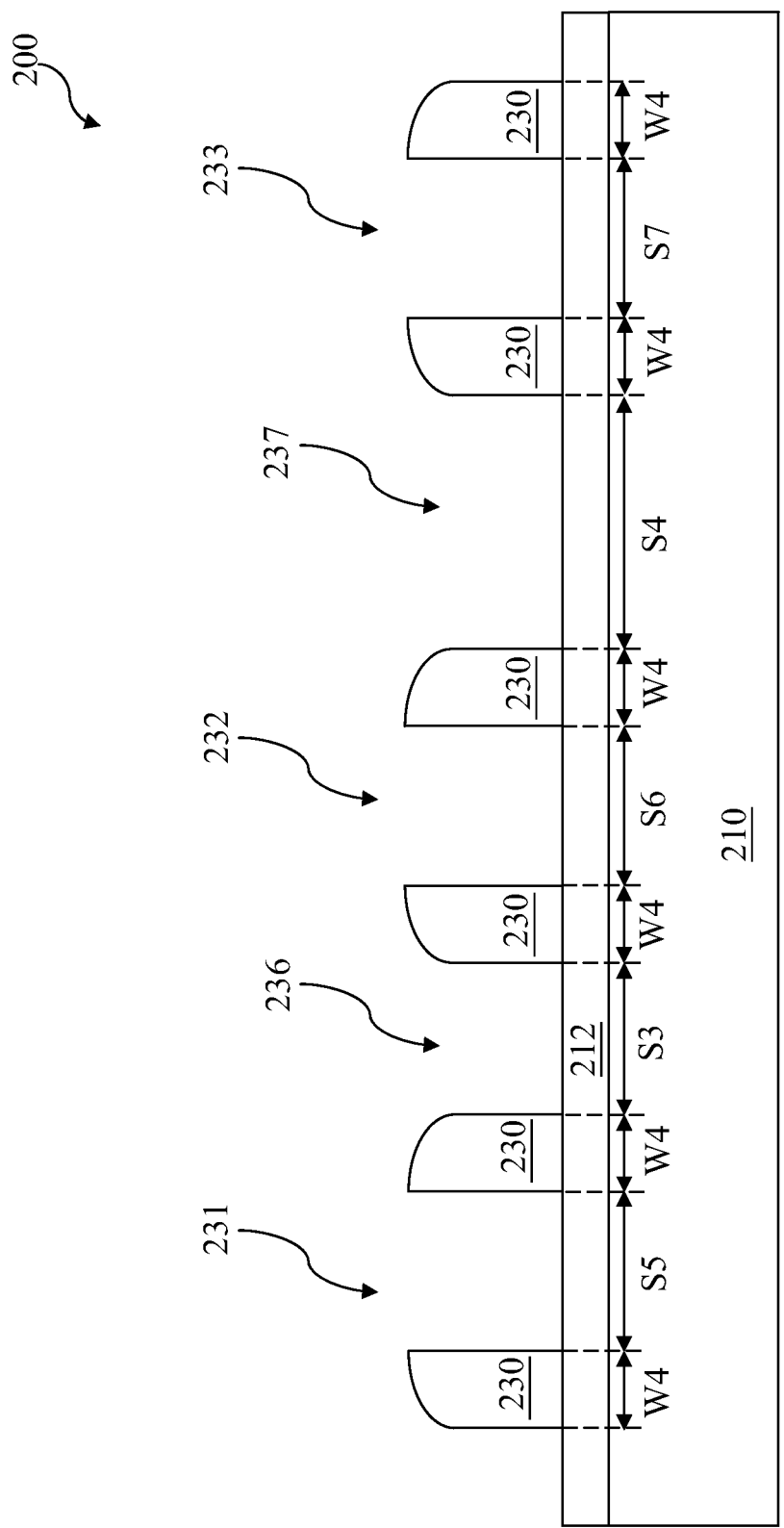

Referring to FIGS. 1 and 4, the method 100 proceeds to step 106 wherein a removing process is provided to remove the first hard mask patterns 221, 222, and 223, while leaving the first sidewall spacers 230. The removing process exposes portions of the target layer 212 between the first sidewall spacers 230. The removing process removes the first hard mask patterns 221, 222, and 223 to form recesses 231, 232, and 233, respectively. The recesses 231, 232, and 233 have spacings S5, S6, and S7, respectively. The spacings S5, S6, and S7 are substantially the same as the widths W1, W2, and W3, respectively. The first sidewall spacers 230 and the target layer 212 remain fairly intact during removing the first hard mask patterns 221, 222, and 223 by applying an etching process with an adequate etching selectivity. The selective etching process may include a wet etch, a dry etch or a combination thereof. In some embodiments, the selective etching process includes a dry etch with fluorine-containing gases, such as $CF_4$, $CH_2F_2$, SF6 or $CHF_3$.

Figure 5:
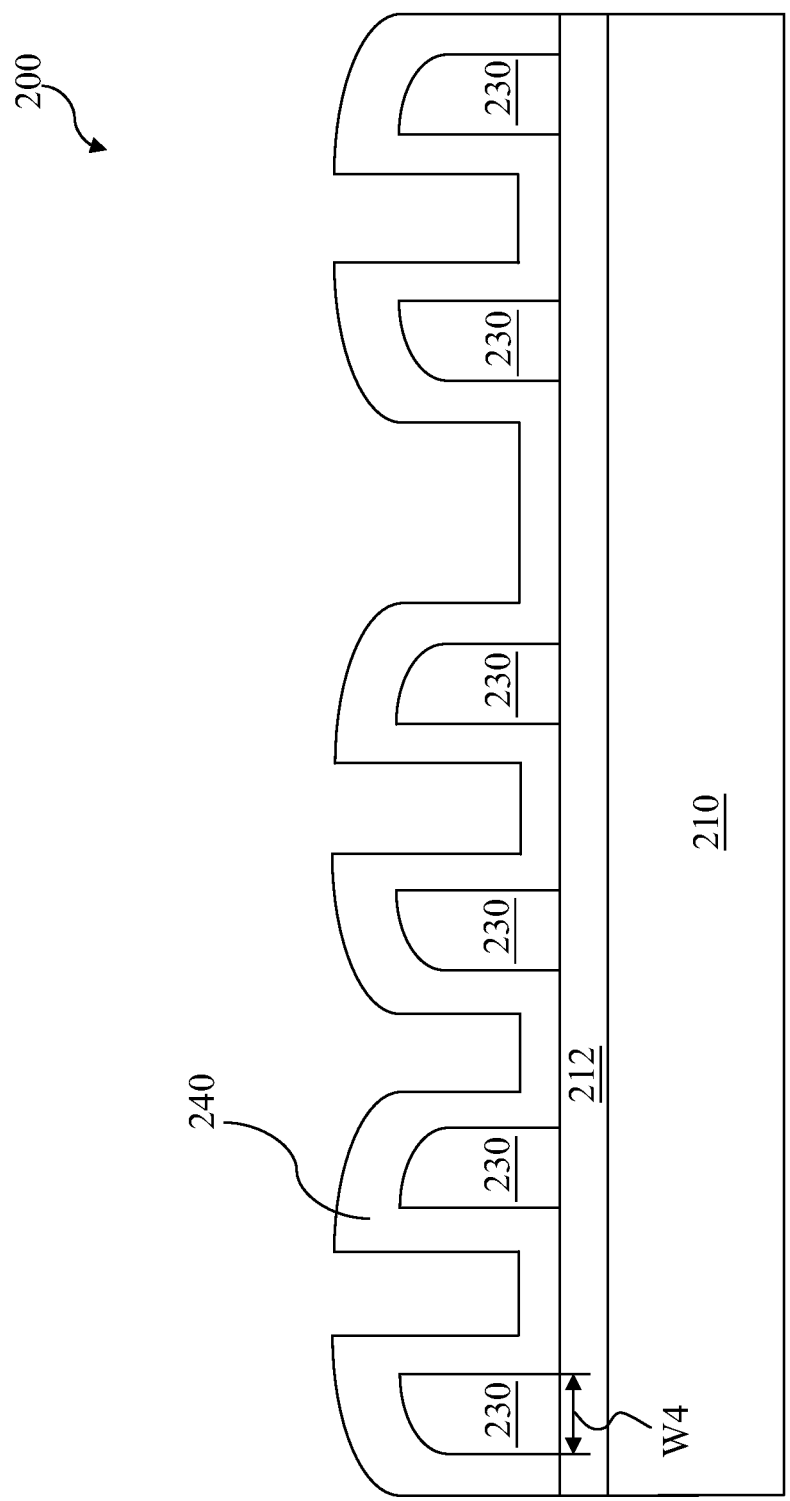

Referring to FIGS. 1 and 5, the method 100 proceeds to step 108 wherein a seal layer 240 is formed over and between the first sidewall spacers 230 on the target layer 212. The deposition process is designed to keep the seal layer 240 being a conformal layer. In some embodiments, the seal layer 240 has a thickness ranging between about 5 angstroms and about 3000 angstroms. In one embodiment, the seal layer 240 includes a material different from the material of the first sidewall spacers 230, therefore, there is an etching selectivity between the seal layer 240 and the first sidewall spacers 230 in a subsequent etching process. In an alternative embodiment, the seal layer 240 includes a material same as the material of the first sidewall spacers 230. In some embodiments, the seal layer 240 comprises $SiO_2$, $Si_3N_4$, silicon carbide (SiC), SiON, nitrided oxide, or combinations thereof. Alternatively, the seal layer 240 may include polysilicon, photo resist, polymer, bottom anti-reflect coating (BARC), metals and other proper materials. The deposition of the seal layer 240 is performed by techniques, such as CVD, physical vapor deposition (PVD), spin-coating, thermal growth or other appropriated deposition techniques.

Figure 6:
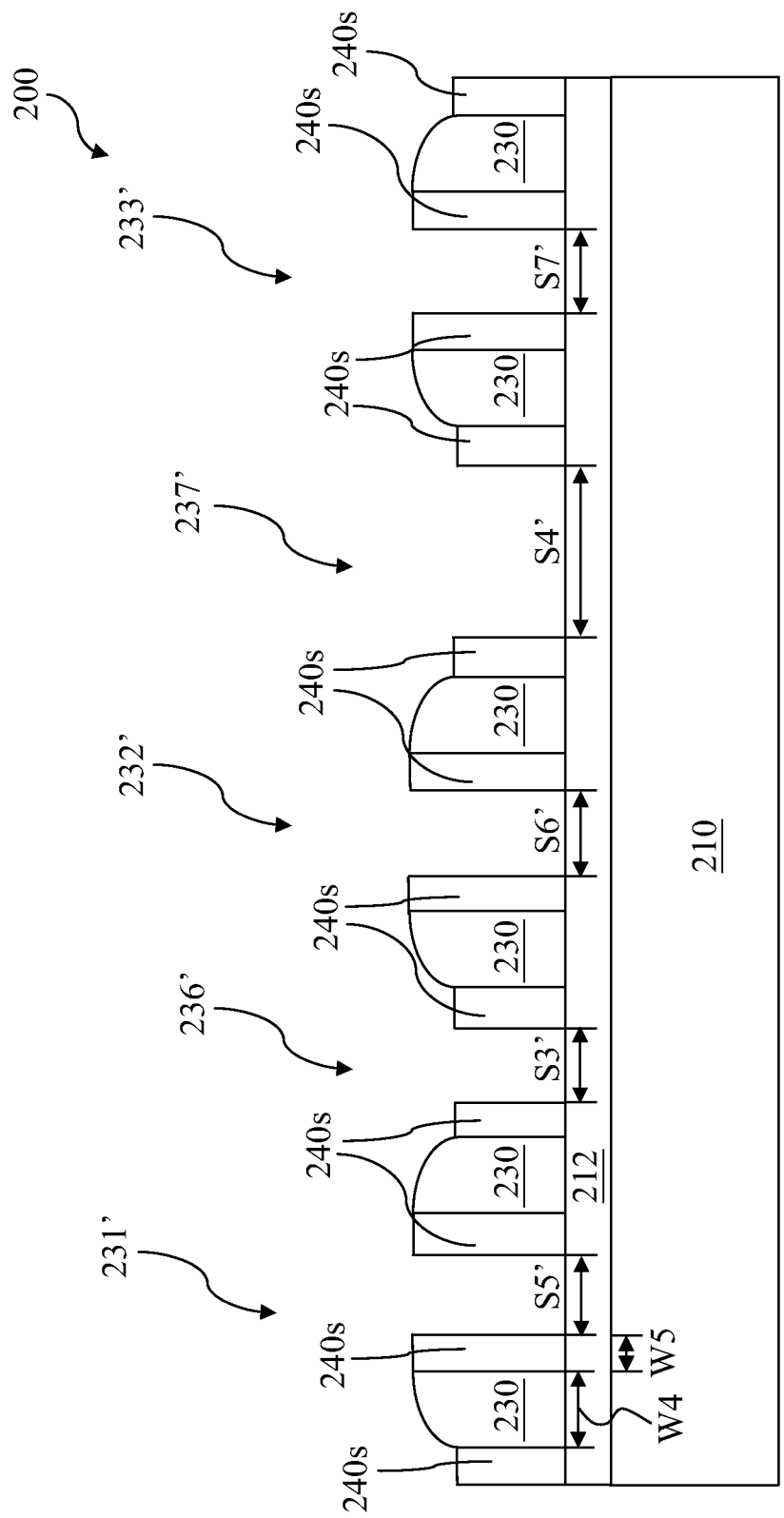

Referring to FIGS. 1 and 6, the method 100 proceeds to step 110 wherein second sidewall spacers 240s are formed adjoining sidewalls of the first sidewall spacers 230. The second sidewall spacers 240s have a width W5. In some embodiments, the width W5 ranges from about 2 nm to about 100 nm. In some embodiments, the width W4 ranges from about 2 nm to about 30 nm. In some embodiments, the second sidewall spacers 240s are formed by applying an etching process to remove portions of the seal layer 240. In some embodiments, the etching process includes an anisotropic dry etching process with an adequate high etching selectivity with respect to the target layer 212 and the first sidewall spacers 230. In one or more embodiments, the etching process comprises a plasma etching process using $CF_4$ and $CH_2F_2$ gases.

The etching process exposes the top areas of the first sidewall spacers 230 and portions of the target layer 212. The portions of target layer 212 uncovered by the first sidewall spacers 230 or the second sidewall spacers 240s are referred to as recesses 231', 236', 232', 237', and 233', as shown in FIG. 6. The recesses 231', 236', 232', 237', and 233' have spacings S5', S3', S6', S4', and S7', respectively. Comparing with the prior recesses 231, 236, 232, 237, and 233 with the spacings S5, S3, S6, S4, and S7, the instant recesses 231', 236', 232', 237', and 233' have the reduced spacings S5', S3', S6', S4', and S7' by adding the second sidewall spacers 240s over the target layer 212. In some embodiments, the spacings S5', S3', S6', S4', and S7' are substantially the same as (S5-2W5), (S3-2W5), (S6-2W5), (S4-2W5), and (S7-2W5), respectively.

Figure 7:
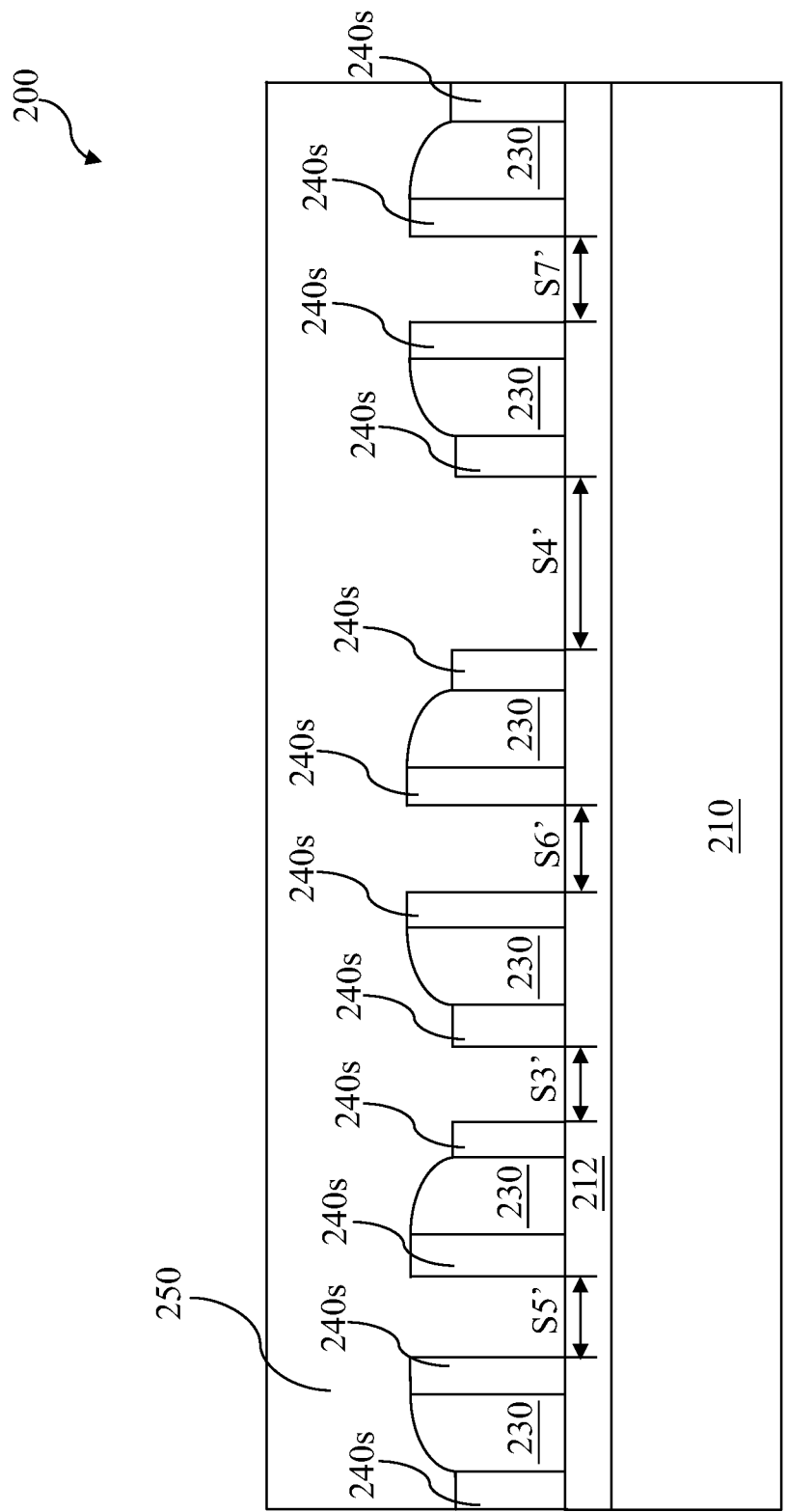

Referring to FIGS. 1 and 7, the method 100 proceeds to step 112 wherein a main layer 250 is formed to fill the recesses 231', 236', 232', 237', and 233' and over the first, second sidewall spacers 230, 240s. In some embodiments, the main layer 250 has a thickness ranging between about 10 angstroms and about 3000 angstroms. In some embodiments, the main layer 250 comprises a material including silicon oxide, silicon nitride, SiON, nitrided oxide, spin-on glass (SOG), anti-reflective coating (ARC), photoresist, organic material, or combinations thereof. In some embodiments, the material of main layer 250 is different from the materials of the first sidewall spacers 230 or the second sidewall spacers 240s, therefore, there is an etching selectivity in a subsequent etching process. The deposition of the main layer 250 is performed by techniques, such as CVD, PVD, spin-coating, thermal growth or other appropriated deposition techniques.

Figure 8:
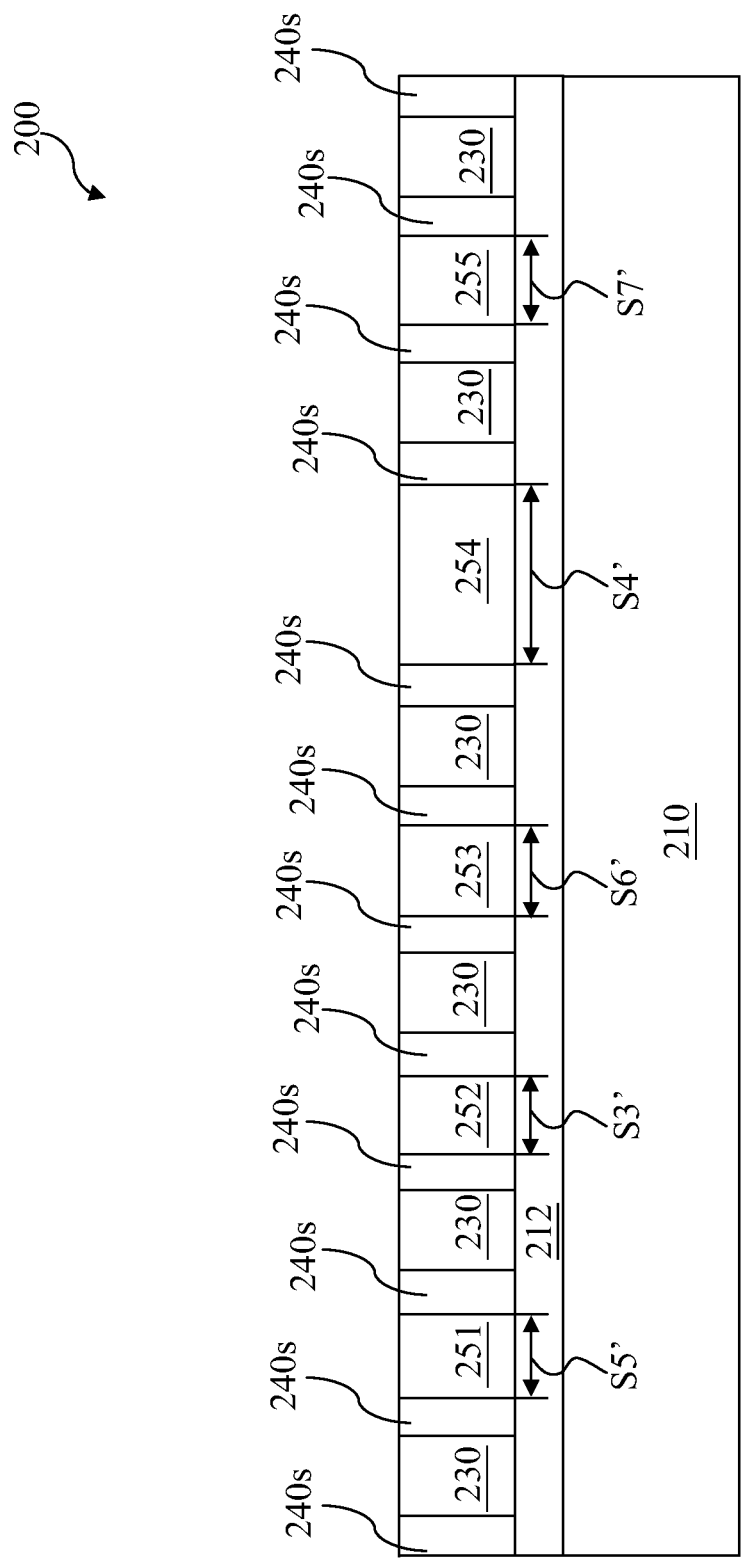

Referring to FIGS. 1 and 8, the method 100 proceeds to step 114 wherein a planarization process is applied to remove the excess portions of the main layer 250 over the first sidewall spacers 230, the second sidewall spacers 240s, and to remove the portions of the main layer 250 outside the recesses 231', 236', 232', 237', and 233'. In some embodiments, the planarization process exposes the top surface of the first sidewall spacers 230, the second sidewall spacers 240s and achieves a planarized surface. In some embodiments, the planarization process is chemical mechanical polishing (CMP) process. The left portions of the main layer 250 filed in the recesses 231', 236', 232', 237', and 233' are referred to as patterns 251, 252, 253, 254, and 255, respectively.

Figure 9:
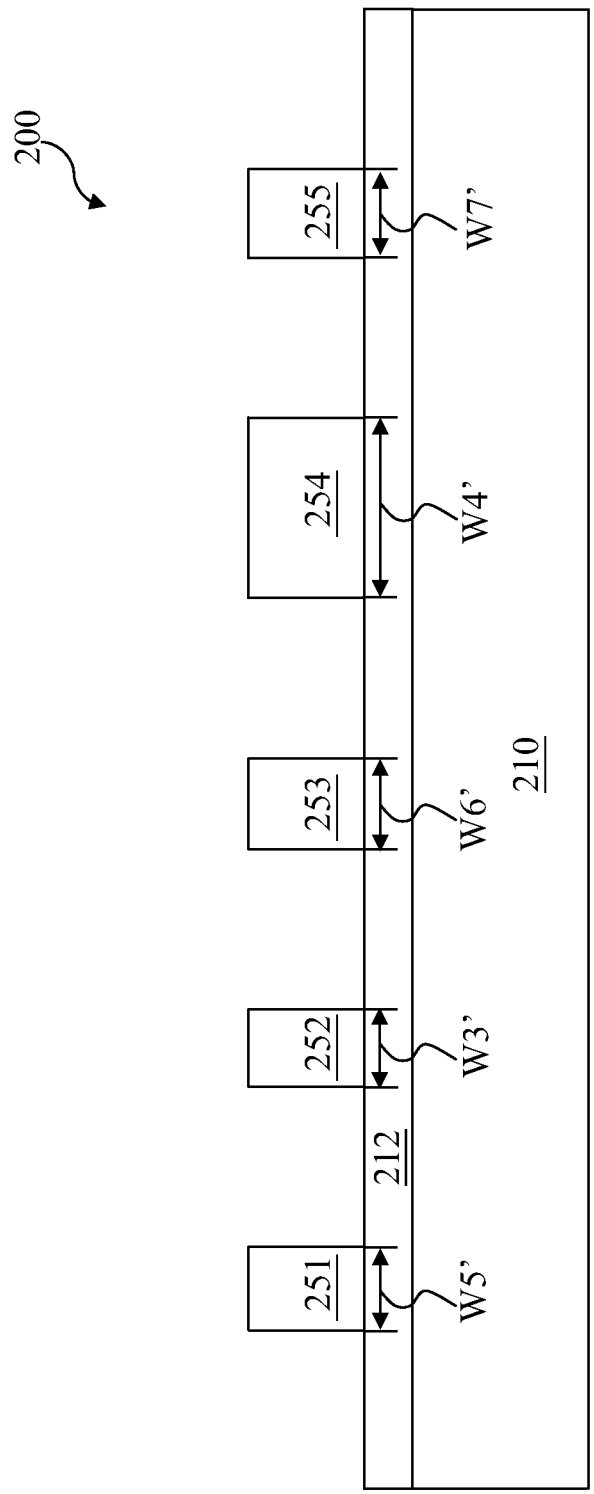

Referring to FIGS. 1 and 9, the method 100 proceeds to step 116 wherein a removing process is applied to remove the first sidewall spacers 230 and the second sidewall spacers 240s, while leaving patterns 251, 252, 253, 254, and 255 over the target layer 212. The patterns 251, 252, 253, 254, and 255 can also be referred to as second hard mask patterns. The portions of the target layer 212 between the second hard mask patterns 251, 252, 253, 254, and 255 are exposed. In some embodiments, the exposed portions of target layer 212 are patterned using the second hard mask patterns in a subsequent etching process.

In some embodiments, the removing process for forming the second hard mask patterns 251, 252, 253, 254, and 255 is an etching process. The etching process, for example, is anisotropic dry etching with an adequate etch selectivity with respect to the target layer 212 to minimize a loss of the target layer 212 during the etching process. In some embodiments, the first sidewall spacers 230 and the second sidewall spacers 240s are etched by a plasma etch with $CF_4$ and $CHF_3$ gases.

The second hard mask patterns 251, 252, 253, 254, and 255 have widths W5', W3', W6', W4', and W7', respectively. In some embodiments, the widths W5', W3', W6', W4', and W7' are substantially the same as the spacings S5', S3', S6', S4', and S7', respectively. As mentioned above, the spacings S5', S3', S6', S4', and S7' are substantially equal to (S5-2W5), (S3-2W5), (S6-2W5), (S4-2W5), and (S7-2W5), respectively. As mentioned above, the spacings S3 and S4 are different in some embodiments. Therefore, the widths W3' and W4' are different in some embodiments. That is, lines with different widths can be made by patterning the target layer 212 using the second hard mask patterns 251, 252, 253, 254, and 255.

The benefits of some embodiments deriving the second hard mask patterns from the first hard mask patterns by an inverse approach include a possibility of forming target features with widths which may be beyond (i.e., smaller than) the patterning limitation of the existing lithography tools. The method in accordance with some embodiments also provides a flexibility of forming target features with different widths, such as line or contact hole features. The method in accordance with some embodiments also provides a manufacturing process using reduced masks to reduce cost of production.

The semiconductor device may undergo further CMOS or MOS technology processing to form various features. For example, the method may proceed to form conductor lines or plugs in the patterned target layer to form dual damascene structures. Copper, copper alloy can be suitable conductors filled in the patterned target layer to form interconnect metallization in integrated circuit devices.

In some embodiments, a method of manufacturing a semiconductor device, comprises forming a first mask pattern over a substrate; forming first spacers adjoining sidewalls of the first mask pattern; removing the first mask pattern; forming second spacers adjoining sidewalls of the first spacers; forming a filling layer over the substrate and within second spacers; and removing the first spacers and the second spacers, but leaving the filling layer to form a second mask pattern.

In some embodiments, a method of manufacturing a semiconductor device, comprises forming a target layer over a substrate; forming a first mask layer including at least three mask patterns; forming first spacers adjoining sidewalls of each of the at least three mask patterns; removing the at least three mask patterns, but leaving the first spacers; conformally forming a seal layer over the first spacers and the substrate; removing portions of the seal layer over top areas of the first spacers and the substrate, but leaving another portions of the seal layer adjoining sidewalls of the first spacers to form second spacers; forming a second mask layer within and over the second spacers; removing portions of the second mask layer to expose top areas of the first spacers and the second spacers; and removing the first spacers and the second spacers, but leaving the second mask layer to form second mask patterns.

In some embodiments, a method of manufacturing a semiconductor device, comprises forming a target layer over a substrate; forming a first hard mask layer including at least three hard mask patterns, wherein the distances between the successive two hard mask patterns are different; forming first spacers adjoining sidewalls of each of the at least three hard mask patterns; removing the at least three hard mask patterns, but leaving the first spacers; conformally forming a seal layer over the first spacers and the substrate; removing portions of the seal layer over top areas of the first spacers and the substrate, but leaving another portions of the seal layer adjoining sidewalls of the first spacers to form second spacers; forming a second hard mask layer within and over the second spacers; removing portions of the second hard mask layer to expose top areas of the first spacers and the second spacers; and removing the first spacers and the second spacers, but leaving the second hard mask layer to form second hard mask patterns; wherein at least two of the second hard mask patterns have different widths.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same or similar purposes and/or achieving the same or similar advantages disclosed herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first mask pattern over a substrate, at least one portion of the first mask pattern has a first width;
   forming first spacers adjoining sidewalls of the first mask pattern, the first spacers each having a first spacer width;
   removing the first mask pattern leaving an opening between the first spacers, the opening having the first width;
   reducing the first width of the opening left by removing the first mask pattern by forming second spacers adjoining sidewalls of the first spacers, the first spacers each having the first spacer width and the second spacers being formed at least within the opening;
   forming a filling layer over the substrate and between the second spacers; and
   removing the first spacers and the second spacers, while leaving the filling layer to form a second mask pattern, wherein at least one portion of the second mask pattern is formed in a position that substantially corresponds with a position of the at least one portion of the first mask pattern, and the at least one portion of the second mask pattern has a second width less than the first width.

2. The method of claim 1, wherein said forming the second spacers includes:
   forming a seal layer overlying the first spacers and the substrate; and
   removing portions of the seal layer over top areas of the first spacers and the substrate, while leaving other portions of the seal layer adjoining sidewalls of the first spacers to define the second spacers.

3. The method of claim 1, further comprising:
   removing a portion of the filling layer to expose top areas of the first spacers and the second spacers.

4. The method of claim 3, wherein said removing the portion of the filling layer is performed by a chemical mechanical polishing (CMP) process.

5. The method of claim 1, further comprising:
   forming a target layer over the substrate before providing the first mask pattern.

6. The method of claim 5, further comprising:
   patterning the target layer using the second mask pattern.

7. The method of claim 1, wherein the first spacers comprise a material different from a material of second spacers.

8. The method of claim 1, wherein the filling layer comprises a material different from a material of the first spacers or the second spacers.

9. The method of claim 1, wherein the filling layer comprises a material selected from the group consisting of silicon oxide, silicon nitride, SiON, nitrided oxide, spin-on glass (SOG), anti-reflective coating (ARC), photoresist, organic material, and combinations thereof.

10. The method of claim 1, wherein the second mask pattern includes at least two lines with different line widths.

11. The method of claim 1, wherein the second spacers have a second spacer width, and the first spacer width or the second spacer width is from about 2 nm to about 30 nm.

12. The method of claim 1, wherein the second mask pattern includes a material selected from the group consisting of silicon oxide, silicon nitride, silicon carbide, oxynitride, nitrided oxide, and combinations thereof.

13. A method, comprising:
   forming a target layer over a substrate;
   forming a first mask layer, including at least three mask patterns, over the substrate, at least one mask pattern of the at least three mask patterns has a first width;
   forming first spacers adjoining sidewalls of each of the at least three mask patterns, the first spacers each having a spacer width;
   removing the at least three mask patterns, while leaving the first spacers creating at least three openings between the first spacers, the at least three openings having respective widths, at least one of the respective widths is equal to the first width;
   reducing the widths of the at least three openings left by removing the at least three mask patterns by forming a conformal seal layer over the first spacers and the substrate, the first spacers each having the spacer width;
   removing portions of the seal layer over top areas of the first spacers and the substrate, while leaving other portions of the seal layer adjoining sidewalls of the first spacers to form second spacers, at least within the at least three openings;
   forming a second mask layer between and over the second spacers;
   removing portions of the second mask layer to expose top areas of the first spacers and the second spacers; and
   removing the first spacers and the second spacers, while leaving the second mask layer to form second mask patterns,
   wherein at least one of the second mask patterns is formed in a position that substantially corresponds with a position of the at least one mask pattern having the first width, and the at least one second mask pattern has a second width less than the first width.

14. The method of claim 13, wherein distances between different pairs of adjacent mask patterns are different.

15. The method of claim 13, wherein at least two of the second mask patterns have different widths.

16. The method of claim 13, wherein the first mask layer comprises silicon oxide, and the first spacers include a material selected from the group consisting of silicon nitride, oxytride, nitrided oxide, metal, TiN, and combinations thereof.

17. The method of claim 13, wherein the first mask layer comprises silicon nitride, and the first spacers include at least one of oxytride or silicon oxide.

18. The method of claim 13, wherein the first mask layer is photoresist or organic material, and the first spacers include at least one of silicon nitride, oxytride, or nitrided oxide.

19. The method of claim 13, further comprising:
patterning the target layer using the second mask patterns.

20. A method of manufacturing a semiconductor device, comprising:
forming a target layer over a substrate;
forming a first hard mask layer, including at least three hard mask patterns, over the substrate, wherein at least one hard mask pattern of the at least three hard mask patterns has a first width, and distances between different pairs of adjacent hard mask patterns are different;
forming first spacers adjoining sidewalls of each of the at least three hard mask patterns, the first spacers each having a spacer width;
removing the at least three hard mask patterns, while leaving the first spacers creating at least three openings between the first spacers, the at least three openings having respective widths, at least one of the respective widths is equal to the first width;
reducing the widths of the at least three openings left by removing the at least three hard mask patterns by forming a conformal seal layer over the first spacers and the substrate, the first spacers each having the spacer width;
removing portions of the seal layer over top areas of the first spacers and the substrate, while leaving other portions of the seal layer adjoining sidewalls of the first spacers to form second spacers, at least within the at least three openings;
forming a second hard mask layer between and over the second spacers;
removing portions of the second hard mask layer to expose top areas of the first spacers and the second spacers; and
removing the first spacers and the second spacers, while leaving the second hard mask layer to form second hard mask patterns,
wherein at least one of the second hard mask patterns is formed in a position that substantially corresponds with a position of the at least one hard mask pattern having the first width, the at least one second hard mask pattern has a second width less than the first width, and at least two of the second hard mask patterns have different widths.

* * * * *